US005936209A

United States Patent [19]

[11] Patent Number: 5,936,209

Alton, Jr.

[45] Date of Patent: Aug. 10, 1999

[54] FLUID COUPLED SUBWOOFER ACOUSTIC ENCLOSURE SYSTEM WITH VENT CHAMBER

[75] Inventor: Noyal J. Alton, Jr., Virginia Beach, Va.

[73] Assignee: Sound Related Technologies, Inc., Va. Beach, Va.

[21] Appl. No.: 09/037,317

[22] Filed: Mar. 9, 1998

[51] Int. Cl.[6] .......... H05K 5/00

[52] U.S. Cl. .......... 181/151; 181/156; 181/145

[58] Field of Search .......... 181/145, 146, 181/151, 155, 156, 199

[56] References Cited

U.S. PATENT DOCUMENTS 5,281,777 1/1994 Alton, Jr. .......... 181/151

*Primary Examiner*—Khanh Dang

*Attorney, Agent, or Firm*—Kaufman & Canoles

[57] ABSTRACT

An acoustic enclosure system for a loudspeaker includes a vent chamber adjacent to and spanning at least one chamber assembly. A loudspeaker is mounted in each of the chamber assemblies such that the speakers face away from each other when there are more than one speaker. The vent chamber has a port in a side wall that is open to the outside of the enclosure. Each chamber assembly has a port opening to the vent chamber and contains a fluid chamber with a flexible bladder that is filled with fluid and maintained in the chamber assembly a given distance from the corresponding loudspeaker. Each bladder contacts the interior surfaces of the side walls that form the fluid chamber. A flexible support is provided underneath each bladder so that the bladder is substantially maintained a specified distance from the wall supporting the speaker.

15 Claims, 7 Drawing Sheets

FLUID COUPLED SUBWOOFER ACOUSTIC ENCLOSURE SYSTEM WITH VENT CHAMBER

FIELD OF THE INVENTION

The invention relates to loudspeaker enclosures and more particularly to a fluid damped acoustic enclosure system.

BACKGROUND OF THE INVENTION

As disclosed in U.S. Pat. No. 5,281,777 issued to Alton, Jr., the contents of which are incorporated herein by reference, a loudspeaker vibrating in isolation produces very little sound. The reason for this is that the waves formed in the front and back of the speaker can effectively cancel each other out. When the loudspeaker's cone is thrust forward, a high-pressure compression is formed in the front and a low pressure rarefaction is formed in the back of the cone. If the wavelength of the sound is large compared to the dimensions of the loudspeaker, an air flow will be set up between the high-pressure and low-pressure regions with the result that the sound intensity is substantially reduced.

To prevent such reduction in sound intensity, a loudspeaker may be mounted in a baffle. The baffle prevents the air in front from communicating with the air in back of the speaker. A baffle is effective as long as the resulting path length between the front and back of the speaker is greater than the wavelength of the sound. In other words, the time required for a disturbance to travel from the front to the back must be greater than one period of the cone's motion.

Loudspeakers however, are not normally mounted in baffles. Typically, loudspeakers are mounted in an enclosure. While such an arrangement prevents the transport of air from the front to the back of the loudspeaker, other problems arise that are related to low frequency audio reproduction. With respect to low frequency audio (1–150 Hertz), the human ear cannot generally detect audio signals below approximately 20 Hz. Yet, the vibrating sensations felt by audio signals below 20 Hz that are typically present during a live performance enhance the listening experience. However, even the best low frequency speaker systems, or sub-woofers as they are known, are only able to efficiently reproduce low frequency signals down to about 15 Hz and generally require a great deal of power to do so.

SUMMARY OF THE INVENTION

Accordingly, it s an object of the present invention to provide an acoustic speaker system that efficiently reproduces low frequency audio signals.

Another object of the present invention is to provide an acoustic speaker system whose low frequency or bass response closely simulates that of actual instrumental tones.

Still another object of the present invention is to provide an acoustic speaker system that efficiently reproduces audio signals below 15 Hz.

Other objects and advantages of the present invention will become more obvious hereinafter in the specification and drawings.

In accordance with the preferred embodiment of the present invention, an acoustic enclosure system for a loudspeaker is provided which includes two acoustic chamber assemblies and a vent chamber. The vent chamber is separated from the assemblies by an interior horizontal wall and spans the length of the assemblies. Each acoustic chamber assembly includes first and second chambers which are separated by a vertical speaker support wall in which a loudspeaker is sealably mounted, and the speakers are oriented such that they face in opposite directions.

The second chambers each have a port in the interior horizontal wall that is open to and communicated with the vent chamber. The vent chamber has a port that located in a side wall of the vent chamber and is open to and communicates with the outside of the enclosure. A baffle is located in the vent chamber which acts to direct acoustic waves toward the vent port and out of the vent chamber.

Each of the first chambers is airtight and contains a fluid chamber with a flexible bladder that is filled with fluid and maintained in the first chamber at a given distance from the corresponding loudspeaker. The flexible bladders receive acoustic pressure waves generated by the loudspeakers. Each of the bladders contacts the interior surfaces that form the fluid chamber. A flexible support is provided between each of the bladders and the vertical wall supporting the speaker so that the bladders are each substantially maintained a distance L from the respective speaker support walls. Using this configuration, the entire enclosure cooperates to act as a diaphragm to deliver a signal.

This enclosure system produces a $4^{th}$ order bandpass alignment which enables tuning of the bass wave for the cabinet. The wave has a chance to form and expand; thus, the bandpass cabinet can eliminate unwanted frequencies.

DETAILED DESCRIPTION OF THE INVENTION

Figure 1:
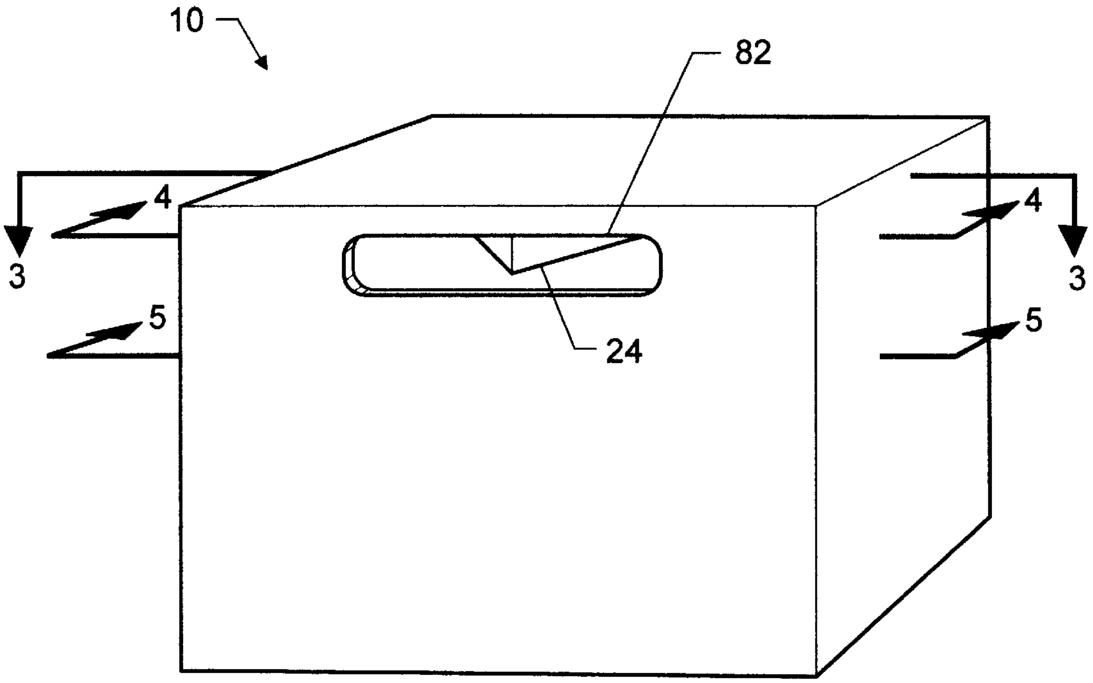
FIG. 1 is front perspective view of an acoustic enclosure according to the preferred embodiment of the invention.
Figure 2:
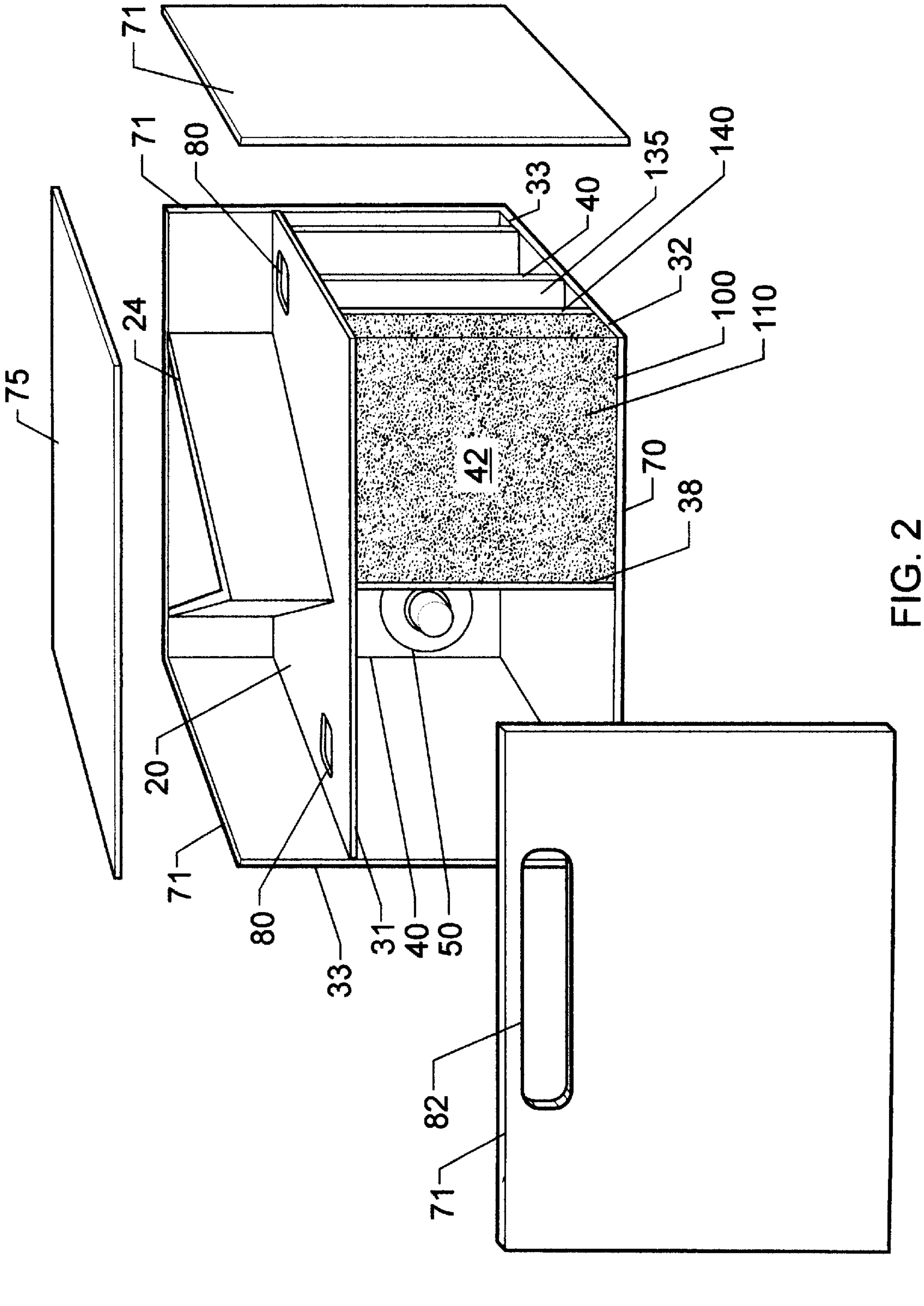
FIG. 2 is a partially exploded view of the enclosure of FIG. 1.
Figure 3:
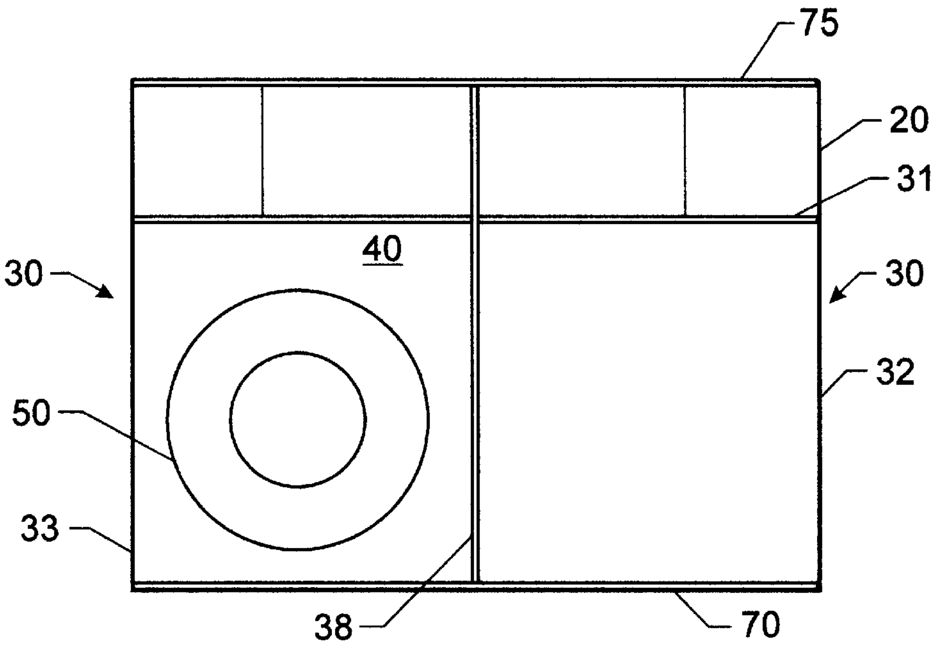
FIG. 3 is a front cross sectional view of the acoustic enclosure of FIG. 1 taken along line 3—3.

As shown in FIGS. 1–3, the preferred embodiment of the present invention is an improved acoustic enclosure system 10 includes two acoustic chamber assemblies 30 and a vent chamber 20. The vent chamber 20 is separated from the assemblies 30 by an inner horizontal wall 31 and spans the length of the assemblies 30. Each acoustic chamber assembly 30 includes a first chamber 32 and a second chamber 33 which are separated by a vertical wall 40 in which a loudspeaker 50 is sealably mounted. The loudspeakers 50 are oriented to face in opposite directions. The second chambers 33 each have a port 80 in the inner horizontal wall 31 that is open to and communicates with the vent chamber 20. The acoustic chamber assemblies 30 are each further defined by a bottom wall 70 and side walls 71, and the assemblies are separated from each other by inner vertical walls 38. Access panels (not shown) may be provided as necessary to service the interior of the acoustic enclosure 10. As an example only, an access panel may be located in a side wall 71 at the rear of each of the loudspeakers 50.

Figure 4:
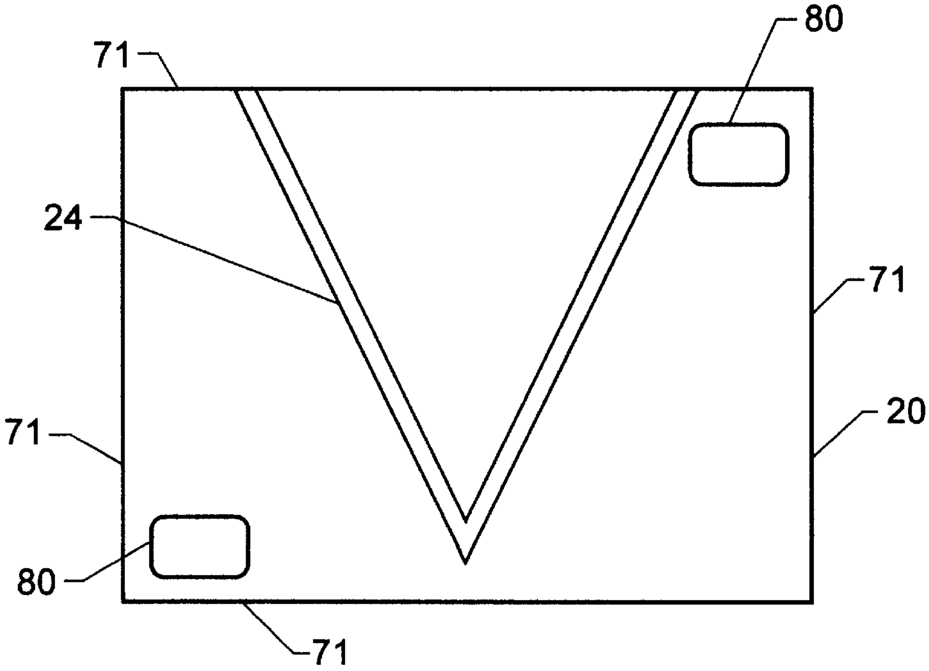
FIG. 4 is a top cross sectional view of the acoustic enclosure of FIG. 1 taken along line 4—4.

Referring to FIGS. 2 and 4, the vent chamber 20 has a port 82 that is open to and communicates with the outside of the enclosure 10. In addition, the vent chamber 20 includes a baffle 24 that is attached to a side wall 71 opposite the side wall 71 containing the port 82. The baffle 24 is tapered and extends into the vent chamber 20 to a point spaced apart from the port 82. The interior of the baffle 24 may be insulated to prevent the baffle surface from resonating and producing unwanted frequencies. Although the baffle is typically constructed from wood, other materials such as plastics, metals or composites may be used. In addition, the configuration of the baffle may be modified by changing the angular relationship of the baffle edges or by providing curved baffle surfaces.

Figure 5:
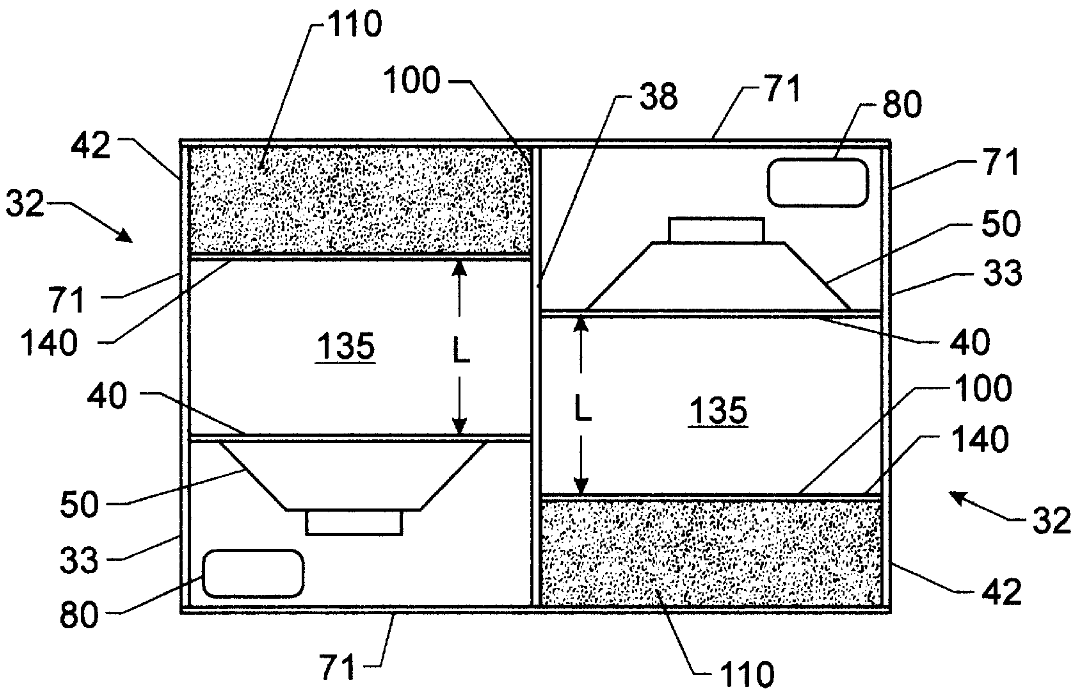
FIG. 5 is a top cross sectional view of the acoustic enclosure of FIG. 1 taken along line 5—5.

As shown in FIGS. 2 and 5, each second chamber 33 has a loudspeaker 50 mounted in the vertical wall 40 such that the speaker 50 is positioned over a corresponding opening (not shown) in the vertical wall 40. The speakers 50 are oriented to face in opposite directions and can be any conventional low frequency dynamic loudspeakers or woofers, the choice of which is not a limitation on the present invention.

Referring again to FIG. 2, the vent chamber 20 is further defined by a top wall 75 and the side walls 71. The side walls 71 act as the sound/vibration delivery mechanism (i.e., diaphragm), and may be continuous or segmented. However, the continuous side walls 71 generally provide a more continuous waveform than an enclosure having a segmented walls. If segmented walls are used, they should be designed to continue the development of the waveform.

The first chambers 32, as shown in FIGS. 2 an 5, further include a fluid chamber 42 which houses a flexible bladder 100 a distance L from the corresponding loudspeaker 50. The bladders 100 are filled with a liquid 110 via a valve (not shown). Once filled, the bladders 100 may be permanently sealed and installed in their respective fluid chambers 42. Alternatively, the valve may be a resealable valve and the bladder 100 may be removable with respect to the fluid chamber 42 to facilitate the filling and emptying of the bladder 100. The liquid 110 is selected such that it remains in its liquid phase throughout the range of expected operating temperatures of the system. For most purposes, the liquid 110 may be water. However, if operation of the system 10 at colder temperatures is required, salt water or water with an antifreeze additive may be appropriate. Conversely, at extremely high temperatures, a water/coolant mixture may be required to prevent boiling. The amount of water or mixture thereof used to fill bladder 100 is approximately equal to one gallon of liquid for every 2" of loudspeaker diameter. For example, if loudspeaker 50 has an 18" diameter, 9 gallons of liquid 110 are required to fill bladder 100.

Figure 6:
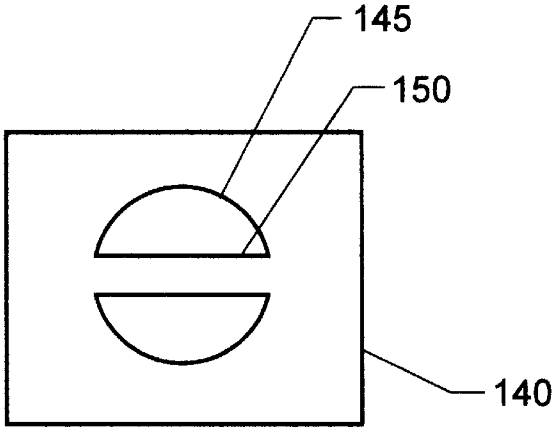
FIG. 6 is a plan view of the of the flexible wall of the acoustic enclosure of the present invention.

Each bladder 100 is supported and maintained at the distance L from corresponding loudspeaker 50 by the flexible wall 140 that further defines the fluid chamber 42. This flexible wall is fixed to and supported at the side walls 71, inner horizontal wall 31, inner vertical wall 40 and bottom wall 70. To simplify the discussion and analysis of the present invention, it will be assumed that the flexible wall 140 is generally vertical such that L is substantially constant. As shown in FIG. 6, flexible wall 140 is designed with an opening 145 spanned by a crossbar 150 to allow sound pressure generated by the loudspeakers 50 to pass therethrough.

Referring again to FIG. 2, as each bladder 100 is filled, it expands to substantially fully contact the interior of the fluid chamber 42. The bladder 100 is filled so that the fluid contents are under a pressure of about 2–3 psi. The bladder 100 may be installed from the side walls 71 of the enclosure; thus, the side walls 71 are generally a removable part of the enclosure that may be sealed in place by any conventional means. If the bladders 100 are to be emptied and filled from time to time, the valve may be resealable and extend through and be sealed in one of the side walls 71.

The spaces between the vertical walls 40 and the flexible walls 140 act as compression chambers 135 and are sized to about 75% of industry recommended standards. Although industry standards may be used to size the compression chambers 135, such chambers 135 would have decreased output and decreased tactile delivery, since higher pressure in the compression chamber 135 results in more interaction of the liquid with the exterior walls. The compression chambers 135 are preferably insulated using about ¾ inch speaker enclosure insulation. Although the compression chambers 135 may be uninsulated, the insulation 145 has the beneficial effect of decreasing the air compression on the horizontal walls 70, 31 so the fluid vibrational effect on the side walls 71 is more effectively used. The use of insulation reduces the phase and frequency interference that arise as a result of vibrations delivered through the compression chambers 135, fluid chambers 42 and second chambers 33 Thus, the vibrational effect on the side walls 71 effectively comes only from the fluid chambers 42.

In operation, the flexible cone of each loudspeaker 50 generates sound pressure waves of equal and opposite magnitude into both the second chamber 33 and the adjacent acoustic assembly chamber 32. With respect to each of the acoustic assembly chambers 32, the waves impinge upon and pass through the flexible wall 140 through the opening 145. The underside of each bladder 100 receives the waves and transmits them through the liquid 110. The waves propagate through the liquid 110 and are coupled to the side walls 71, horizontal wall 31, bottom wall 70, and flexible wall 140. In this way, sound waves are coupled to relatively rigid radiating surfaces, namely, the enclosure. Since each pressurized bladder 100 is in full contact with the side walls 71, horizontal wall 31, bottom wall 70, and flexible wall 140, there is improved tactile delivery, i.e., the vibrational portion of the signal is more effectively delivered. It has also been found that heating the liquid 110 increases the effective delivery of the vibrational portion of the signal.

Typically, a portion of each pressure wave is simultaneously reflected back towards its source, i.e., speaker 50, causing a reflective damping effect in the area of each of the compression chambers 135 and on the speaker cone. In order to prevent the occurrence of the reflective wave, a fluid dampening material, such as a dacron polyester material as provided in the Wave Reduction Waterbed System™ available from Vinyl Products, Carson City, Nev., may be added to the fluid 110.

Figure 7:
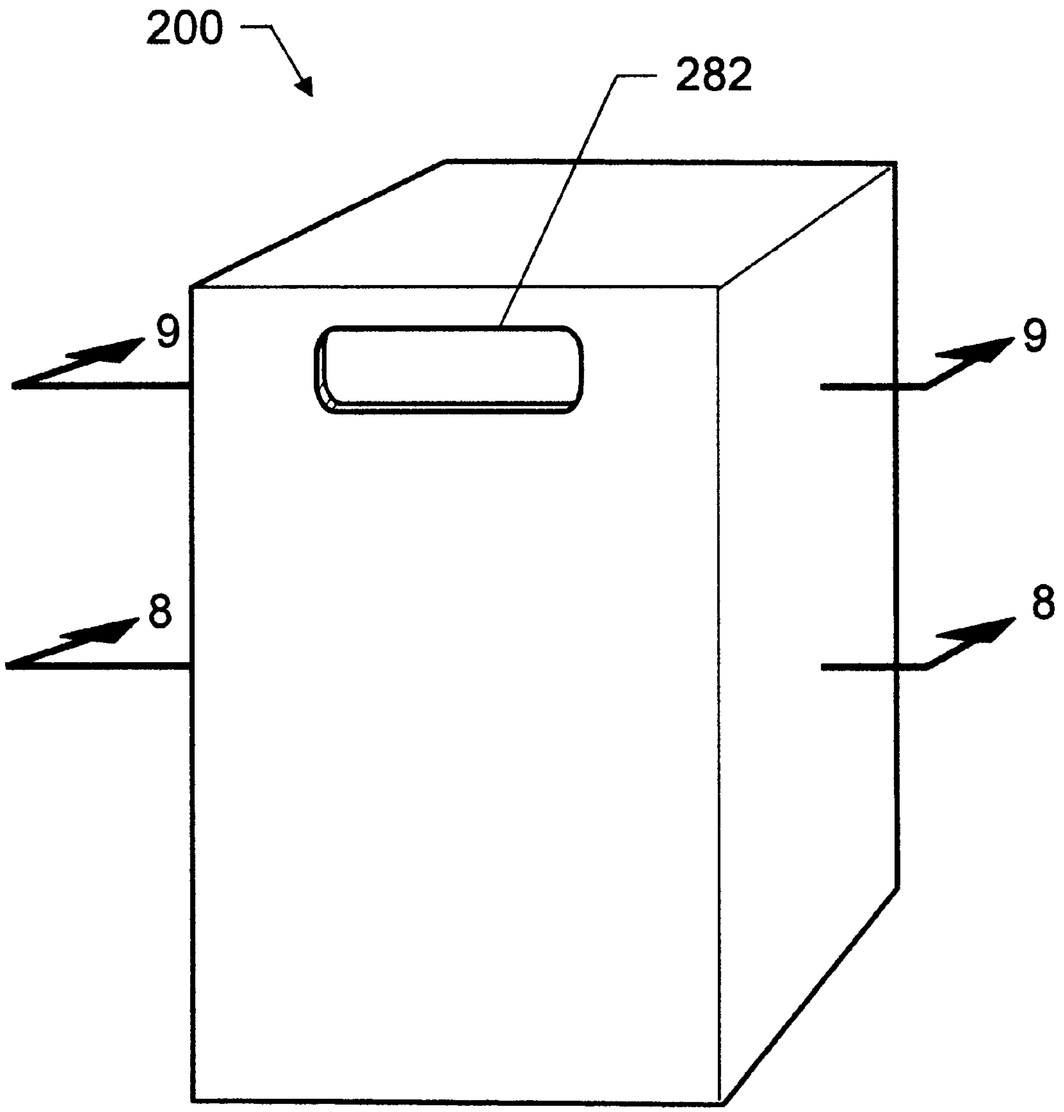
FIG. 7 is a perspective view of another embodiment of the present invention.
Figure 8:
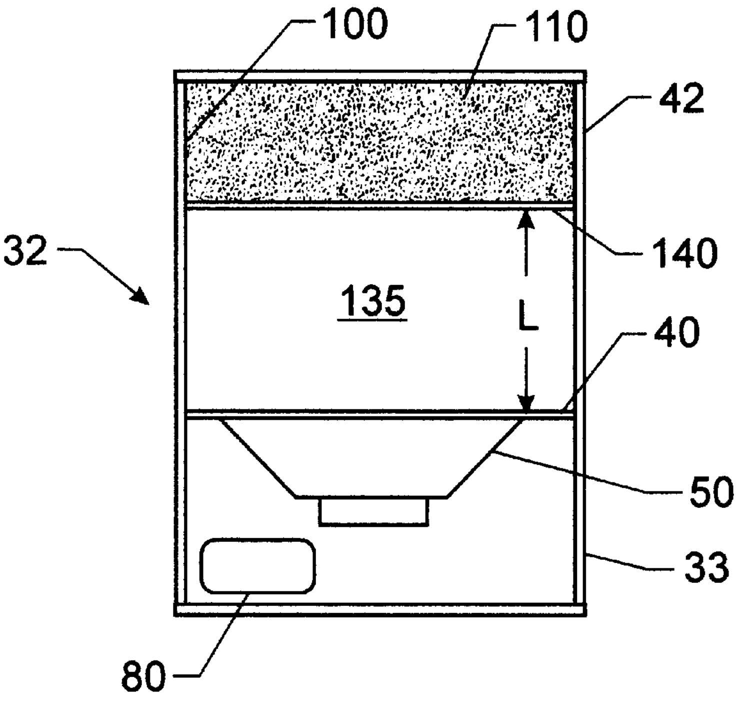
FIG. 8 is a cross sectional view of the acoustic enclosure of FIG. 7 taken along line 8—8.
Figure 9:
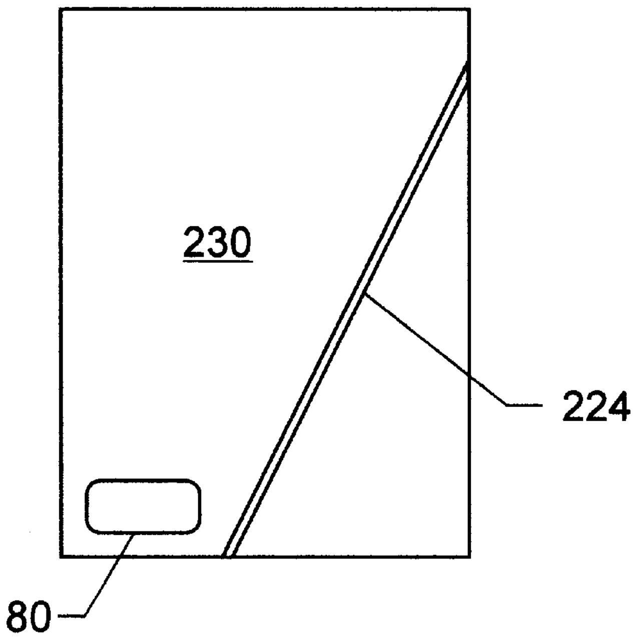
FIG. 9 is a cross sectional view of the acoustic enclosure of FIG. 7 taken along line 9—9.

FIGS. 7–9 illustrate an alternate embodiment of the invention wherein similar elements are labeled with the same reference numbers. As shown in FIGS. 7–9, the acoustic enclosure 200 may have only a single acoustic chamber assembly 32. The acoustic chamber assembly 32 is adjacent to and spanned at the top by a vent chamber 230 having a baffle 224 positioned to direct sound towards and out through the vent port 282. In addition, the baffle 224 may be insulated as in the preferred embodiment. In this embodiment, directionality is achieved through forward pressure through the top vent; thus, producing a polarized delivery system as well as wave shaping and expansion through horizontal polarization.

Figure 10:
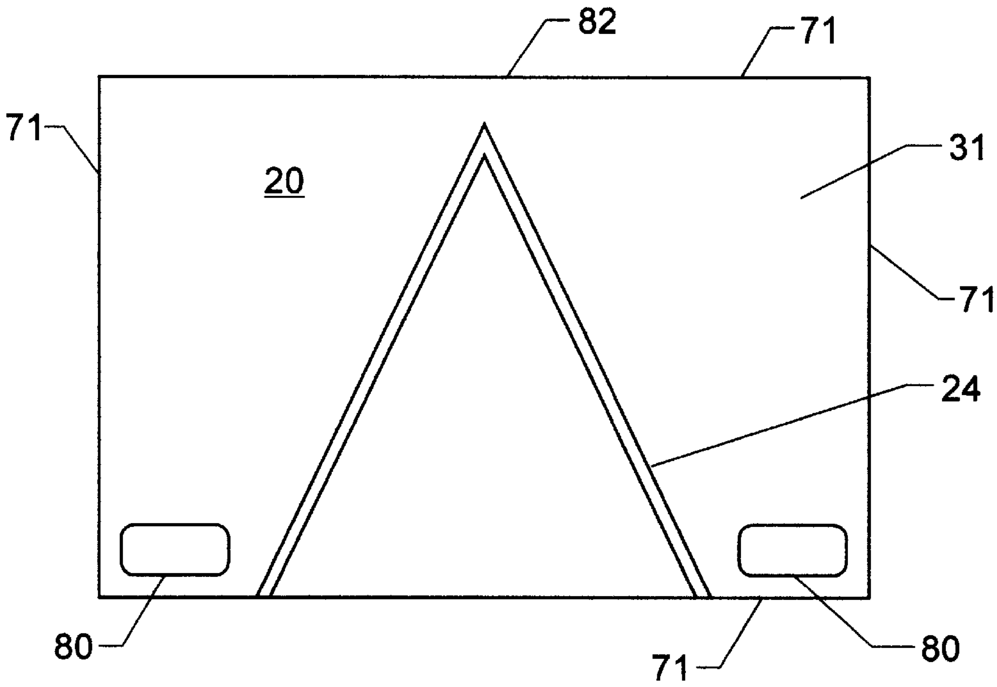
FIG. 10 is a top cross sectional view of a third embodiment of the present invention with the top wall removed.
Figure 11:
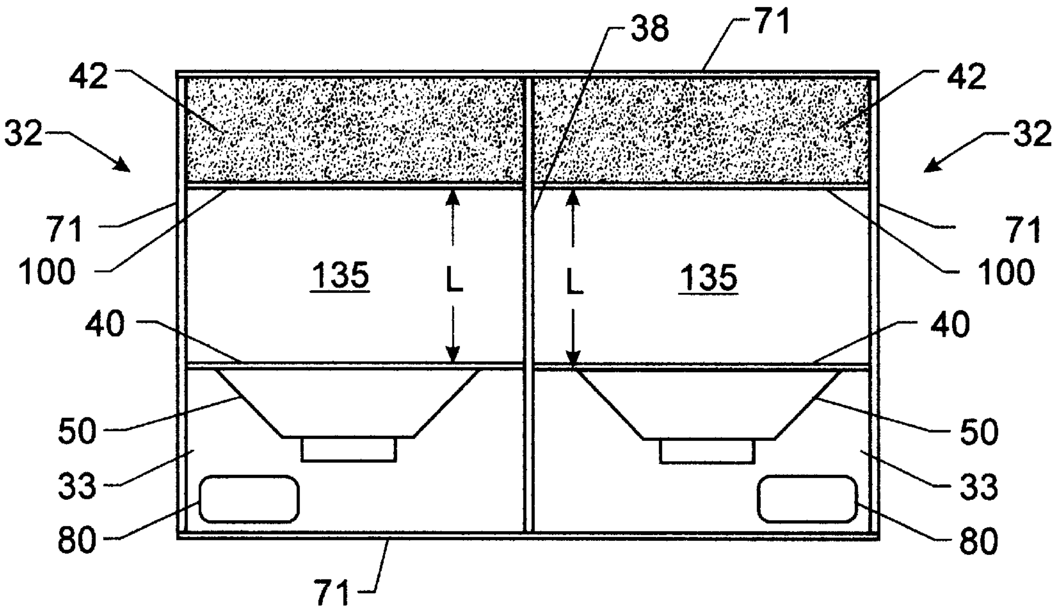
FIG. 11 is a top cross sectional view of the third embodiment with the vent chamber removed in order to facilitate illustration.

FIGS. 10 and 11 show a third embodiment of the present invention that is similar to the embodiment illustrated in FIGS. 1–6, except that the acoustic chamber assemblies 30 are oriented to face in the same direction, so that the fluid chambers 42 are on the same side of the acoustic enclosure 10. In this embodiment, the ports 80 will both be positioned near the same side wall 71. This configuration is easy to maintain, particularly in the field, and can achieve a performance comparable to that in the preferred embodiment.

It is to be understood that the aforedescribed invention will apply to a variety of enclosure shapes and materials used therefore. For example, the enclosure might be cylindrical, rectangular, octagonal, etc. The size of the enclosure may vary, as well as the relative dimensions of the various chambers. As an example only, an enclosure may be about 31 inches long, 22.5 inches wide and 22.5 inches high.

The enclosure is rigidly constructed from a dense material that is typically screwed and glued together. For best radiating characteristics, the material used to construct the enclosure is birch or oak, since these materials have low enough resonances and high density. However, other materials may be used as long as the harmonic resonance of the material is low enough to resonate at the desired low frequencies.

The flexible wall 140 must be strong enough to support the fluid-filled bladder 100 and yet flex as part of a complex spring system that includes the fluid-filled bladder 100 and loudspeaker cone. The flexible wall 140 may have openings with alternate configurations such as a plurality of circular perforations which allow the passage of pressure waves as described above. While the shape and arrangement of any openings or perforations should be such that the structural integrity of flexible wall 140 is not jeopardized, the specifics relating to openings or perforations and their arrangement are not a limitation on the present invention.

The bladder 100 may be constructed from any flexible, liquid-impermeable material such as polyvinyl or rubber. Dimensions of the bladder 100 are selected such that when the required amount of liquid fills same, the bladder 100 contacts the entire interior surfaces of the fluid chamber 42. Although the invention has been described with reference to the use of a bladder 100 to hold the liquid 110, it should be understood that the bladder 100 functions to hold the pressured liquid while fully contacting the interior surfaces of the fluid chamber 42. In addition, the surface of the bladder 100 facing the loudspeaker 50 should be exposed to receive pressure waves from the speaker 50. Thus, it is possible that alternate embodiments of the invention may use other fluid-containing means. For example, a flexible, semi-rigid material may be used to line the interior walls and extend across the inside of the enclosure to form the fluid chamber such that it may be unnecessary to support the fluid chamber with a vertical wall. In this way, the fluid chamber itself acts a the "bladder" and holds the fluid.

The advantages of the present invention are numerous. The dual acoustic chamber assemblies 30 disposed side-by-side beneath a vent chamber 20 permits the larger side walls 71 to act as a diaphragm for the system 10. Thus, the system 10 is capable of producing an improved output which has a stronger tactile effect on the body. The acoustic enclosure system described herein efficiently reproduces audible and subaudible frequencies from 6–150 Hz. Further, by producing a range of resonant frequencies centered about each point resonant frequency, a full low frequency response is achieved.

What is claimed is:

1. An acoustic enclosure system for a loudspeaker comprising:

an enclosure having at least one side wall, a top wall and a bottom wall, the enclosure defining
- a vent chamber spanning a side chamber, the side chamber being separated from the vent chamber by a horizontal inner wall, the vent chamber having a vent port in the at least one side wall communicating with the exterior of the enclosure and having a baffle positioned within the vent chamber to direct acoustic waves toward the vent port,
- the side chamber further comprising
  - a vertical speaker wall which further defines the side chamber into a first chamber and a second chamber;
  - a loudspeaker mounted in the speaker wall such that the loudspeaker faces the first chamber; and
  - a fluid chamber spaced a distance from the loudspeaker, wherein the fluid chamber contains fluid and is substantially in full contact with the at least one side wall.

2. The acoustic enclosure system of claim 1, wherein the fluid is under pressure.

3. The acoustic enclosure system of claim 2, wherein the fluid chamber further comprises a flexible bladder holding fluid and being in substantially full contact with the at least one side wall.

4. The acoustic enclosure system of claim 3, wherein the side chamber further comprises a flexible wall having at least one opening, the flexible wall being fixed to the at least one side wall and positioned between the flexible bladder and the speaker to support the fluid chamber a desired distance from the speaker, wherein a compression chamber is at least partially defined within the side chamber by the speaker wall, the flexible wall, and the at least one side wall.

5. The acoustic enclosure system of claim 4, further comprising insulation disposed at the interior walls of the compression chamber.

6. The acoustic enclosure system of claim 5, further comprising a dampening material in the fluid.

7. The acoustic enclosure system of claim 6, further comprising at least four side walls, wherein the side walls and the end pieces are wood capable of resonating at specified low frequencies.

8. The acoustic enclosure system of claim 1, including two side chambers, the side chambers being separated by a vertical inner wall.

9. The acoustic enclosure system of claim 8, wherein the speakers face in opposite directions.

10. The acoustic enclosure system of claim 9, wherein the fluid is under pressure.

11. The acoustic enclosure system of claim 10, wherein each of the fluid chambers further comprise a flexible bladder, The flexible bladder holding fluid and being in substantially full contact with the at least one side wall.

12. The acoustic enclosure system of claim 11, wherein each of the side chambers further comprise a flexible wall having at least one opening, the flexible wall being fixed to the at least one side wall and positioned between the flexible bladder and the speaker to support the fluid chamber a desired distance from the speaker, wherein within the side chamber a compression chamber is defined by the speaker wall, the flexible wall, the inner wall and the at least one side wall.

13. The acoustic enclosure system of claim 12, further comprising insulation disposed at the interior walls of the compression chambers.

14. The acoustic enclosure system of claim 13, further comprising a dampening material in the fluid.

15. The acoustic enclosure system of claim 14, further comprising at least four side walls, wherein the side walls and the end pieces are wood capable of resonating at specified low frequencies.

* * * * *